US009860998B2

(12) United States Patent
Malik

(10) Patent No.: US 9,860,998 B2
(45) Date of Patent: Jan. 2, 2018

(54) MODULAR DEPLOYABLE DISPLAY UNIT AND SYSTEM THEREOF

(71) Applicant: Mansoor Malik, Dubai (AE)

(72) Inventor: Mansoor Malik, Dubai (AE)

( * ) Notice: Subject to any disclaimer, the term of this patent is extended or adjusted under 35 U.S.C. 154(b) by 0 days.

(21) Appl. No.: 15/090,436

(22) Filed: Apr. 4, 2016

(65) Prior Publication Data

US 2017/0290175 A1 Oct. 5, 2017

(51) Int. Cl.

*G06F 1/16* (2006.01)
*H05K 5/00* (2006.01)
*G09G 3/32* (2016.01)

(52) U.S. Cl.

CPC ............. *H05K 5/0017* (2013.01); *G09G 3/32* (2013.01); *G09G 2300/04* (2013.01); *G09G 2380/02* (2013.01)

(58) Field of Classification Search

CPC ........ H05K 5/0017; H05K 7/14; H05K 1/028; G09G 3/32; G09G 2340/02; G09G 2380/02; G09G 2300/04; G06F 1/1652; G06F 3/0412; G06F 3/14; G06F 1/1601; G06F 1/1615; G06F 1/1626; G06F 1/1641; G06F 1/1684

USPC .................................................... 361/679.27

See application file for complete search history.

(56) References Cited

U.S. PATENT DOCUMENTS 1,430,394 A * 9/1922 McGee ................. G09F 11/295
200/DIG. 11
5,900,850 A 5/1999 Bailey et al.
7,821,479 B2 10/2010 Zhang
2011/0181494 A1 7/2011 Wong et al.
2014/0268532 A1* 9/2014 Nicol .................. G09F 15/0062
361/679.26

FOREIGN PATENT DOCUMENTS

EP 2549463 A1 1/2013

* cited by examiner

*Primary Examiner* — Anthony Haughton
*Assistant Examiner* — Ingrid Wright
(74) *Attorney, Agent, or Firm* — Fitch, Even, Tabin & Flannery LLP

(57) ABSTRACT

This invention covers a display system which includes modular deployable display units, a stand, a power source, a data input device and a display support. Each unit includes a housing, a spool assembly, a flexible electronic display member, an electrical cable and a connecting system for connecting the units to the stand and to one another, in an end to end arrangement. The assembly is mounted within the housing and includes a spool having opposite ends, to which the spool is rotatably mounted. The flexible member includes LEDs for displaying a programmable message. The flexible member has an end coupled to the spool and is displaceable between a wound configuration where the member is wound onto the spool and an unwound configuration where the member is unwound from the spool. A free end of the member is coupled to the support for displaying the message.

20 Claims, 8 Drawing Sheets

MODULAR DEPLOYABLE DISPLAY UNIT AND SYSTEM THEREOF

FIELD OF INVENTION

This invention relates to display units and more specifically, to a modular deployable display unit and system thereof.

BACKGROUND

Various types of portable display apparatus are known in the art. For example, EP 2 549 463 describes a retractable flexible display apparatus; however, such apparatus is not ideal for use in all situations as it is relatively cumbersome to transport and deploy and contains pre-printed messages which are not useful in all circumstances. US2011/0181494 discloses a retractable flexible display apparatus which comprise a plurality Light Emitting Diode (LED) display modules comprising a flexible substrate for supporting the LED's. Due to the overall configuration of the modules, the modules are not suitable for forming a large display, if so desired, nor are the modules easily transported and deployed. U.S. Pat. No. 7,821,479 discloses a rolling LED screen including a plurality of rigid supporting strips of equal lengths and a plurality of pixel units which are disposed at regular intervals along the rigid support strips. This rolling LED screen is cumbersome to transport and heavy to carry and handle due to the plurality of rigid supporting strips. U.S. Pat. No. 5,900,850 discloses a large scale, portable LED image display system comprising one or more panels comprising a netlike structure and LED's mounted on the netlike structure at regular intervals, for forming a matrix for projecting multi-coloured images. The LED display system is not easy to transport nor is it quick to deploy.

A need exists for a versatile portable display apparatus which overcomes the disadvantages of the display apparatus described above. A need also exists for a versatile portable display apparatus which can be easily transported and easily and quickly deployed in a variety of different circumstances. A need further exists for a portable display apparatus or system which can be used to form screens of desired sizes, depending on the requirements.

SUMMARY OF INVENTION

The invention has several aspects. According to a first aspect of the invention there is provided a modular deployable display unit comprising: a spool having a pair of opposite ends and a longitudinal axis extending between the ends, the spool defining an axis of rotation about which the spool is rotatable; a flexible electronic display member which is configured to display a programmable message, the flexible electronic display member being coupled to the spool and being displaceable between: a wound configuration wherein the flexible electronic display member is wound onto the spool; and an unwound configuration wherein the flexible electronic display member is unwound from the spool; at least one electrical cable for supplying electrical energy to the flexible electronic display member; and connecting means for releasably connecting the modular deployable display unit to an additional modular deployable display unit, in an end to end arrangement.

The additional modular deployable display unit may be identical to the modular deployable display unit as described and defined in accordance with the first aspect of the invention.

In a particular embodiment, the modular deployable display unit may further include an elongate housing having a pair of opposite ends and a longitudinal axis extending between the ends. The housing may include a shell defining a hollow internal chamber located within the shell. The hollow internal chamber may have an opening leading out of the shell. The spool may be rotatably mounted within the internal chamber of the housing in an arrangement wherein the axis of rotation of the spool is parallel to the longitudinal axis of the housing. More particularly, the spool may be rotatable mounted within the internal chamber of the housing in an arrangement wherein the flexible electronic display member is located within the internal chamber of the housing when the flexible electronic display member is in the wound configuration. More specifically, when the flexible electronic display member is in the unwound configuration, the flexible electronic display member at least partially extends from the opening in the shell.

More particularly, the connecting means may be configured to connect a particular one of the ends of the spool to an end of a spool of the additional modular deployable display unit. The connecting means may further include means for releasably connecting the modular deployable display unit to a base support structure for supporting the display unit on a substrate surface. More particularly, the connecting means may provide for releasably connecting a particular one of the ends of the spool to the base support structure. The connecting means may further include complementary connecting formations defined on the ends of the spool. More particularly, the complementary connecting formations may define complementary male and female parts which interconnect to one another.

The connecting means may further include electrical connecting means for electrically connecting the modular deployable display unit and the additional modular deployable display unit, in electrical contact with one another. More particularly, the electrical connecting means may be configured for electrically connecting the spool of the deployable display unit and the base support structure, to one another.

The flexible electronic display member may include a plurality of light emitting diodes (LEDs) for displaying the programmable message. The flexible electronic display member may include a flexible support member for supporting the plurality of LEDs thereon. The flexible support member may have a plurality of openings permitting passage of wind therethrough when the flexible electronic display member is in the unwound configuration. The flexible support member may have a net-like configuration. The flexible support member may have one of a knitted and a woven configuration. The flexible support member may be of a light reflective material so as to enhance the visibility of the flexible electronic display member. The flexible support member may be of brightly coloured material. The flexible electronic display member may have a fixed end which is wound onto the spool, in use, and an opposite free end. The flexible electronic display member may have mounting formations disposed at or near the free end thereof, for mounting the flexible electronic display member to a fixed support structure.

According to a second aspect of the invention there is provide a display system including: two or more modular deployable display units, each modular deployable display unit being a modular deployable display unit, as described and defined hereinabove, in accordance with the first aspect of the invention.

The display system may further include a base support structure which is connectable to at least one of said two or more modular deployable display units, the base support structure being locatable upon a substrate surface for supporting the display unit on the substrate surface.

The display system may include a power source for supplying electrical power to the flexible electronic display members of the deployable display units. The power source may be connectable to one of the base support structure and a particular one of the deployable display unit, in an arrangement wherein the power source supplies electrical power to the flexible electronic display members of each of said two or more modular deployable display units.

The display system may include a data input device for inputting said programmable message. The data input device may be in data communication with the flexible electronic display members of said one or more modular deployable display units.

The display system may include a fixed support structure for supporting the flexible electronic display member, when the flexible electronic display member is in the unwound configuration. More specifically, the fixed support structure may be configured for supporting the free end of the flexible electronic display member in an arrangement wherein the flexible electronic display member extends between the spool and the fixed support structure, for displaying the programmable message, in use. The fixed support structure may include a base formation and an elongate support member which is mounted to the base formation in an arrangement wherein the elongate support member projects upwardly from the base formation. The base formation may include a support body to which the elongate support member is mounted and a number of support legs mounted to the support body for supporting the support body. In a particular embodiment, the support legs of the fixed support structure may be displaceably mounted to the support body so as to be displaceable between a deployed position wherein the support legs are placed into contact with the substrate surface for stabilising the support body; and a stowed position wherein the support legs fold inwardly towards the support body so as to assume a compact configuration to facilitate stowage of the fixed support structure. More specifically, in a particular embodiment, the base formation may have an annular configuration in top view and the support legs may have a triangular shape. As such, each triangularly shaped support legs may have a proximal side displaceably mounted to the base formation and two unattached sides which are free. More specifically, each triangularly shaped support leg may be dimensioned so that when the support legs are displaced into the stowed position, the unattached sides of the support leg are disposed adjacent to one another and in contact with one another, such that the support legs and the base formation assume a cone shape.

In a particular embodiment, the elongate support member may be telescopically extendible to facilitate stowage of the elongate support member, in use.

BRIEF DESCRIPTION OF DRAWINGS

Further features of the invention are described hereinafter by way of a non-limiting example of the invention, with reference to and as illustrated in the accompanying diagrammatic drawings. In the drawings.

DETAILED DESCRIPTION

Figure 1A:
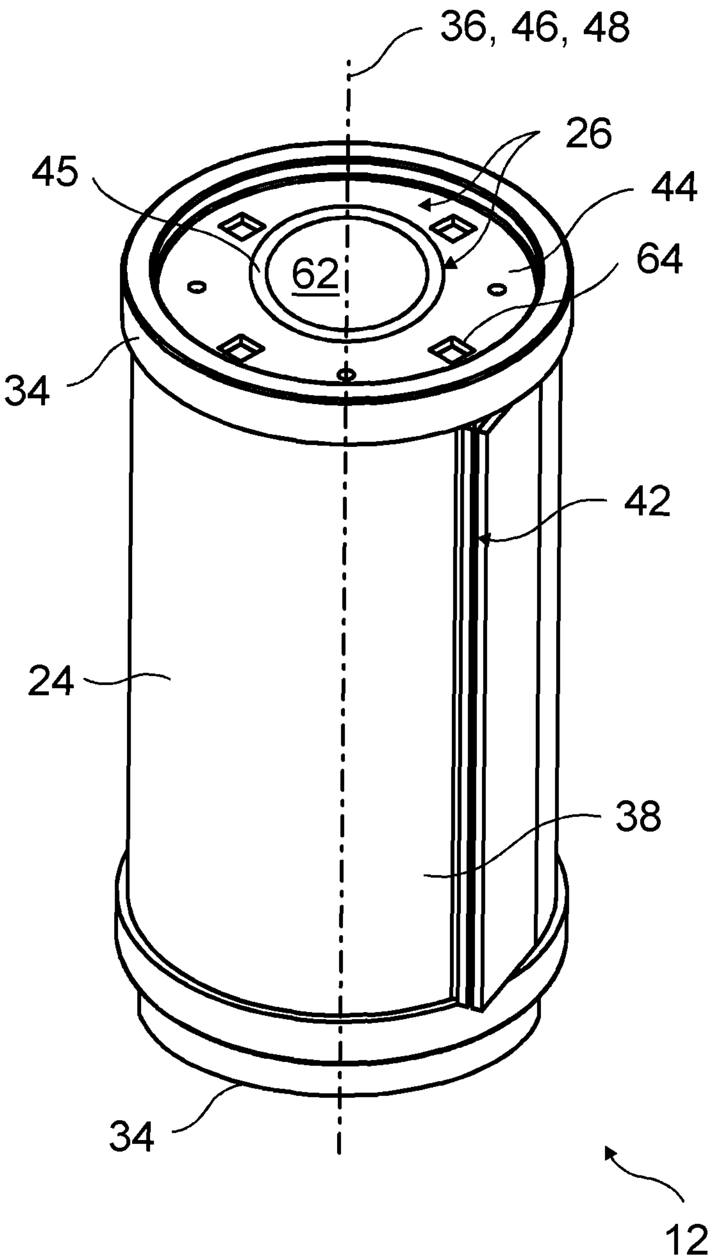
FIG. 1A shows a perspective view of a modular deployable display unit, in accordance with the invention, illustrated with a flexible electronic display member of the display unit in a wound configuration.
Figure 1B:
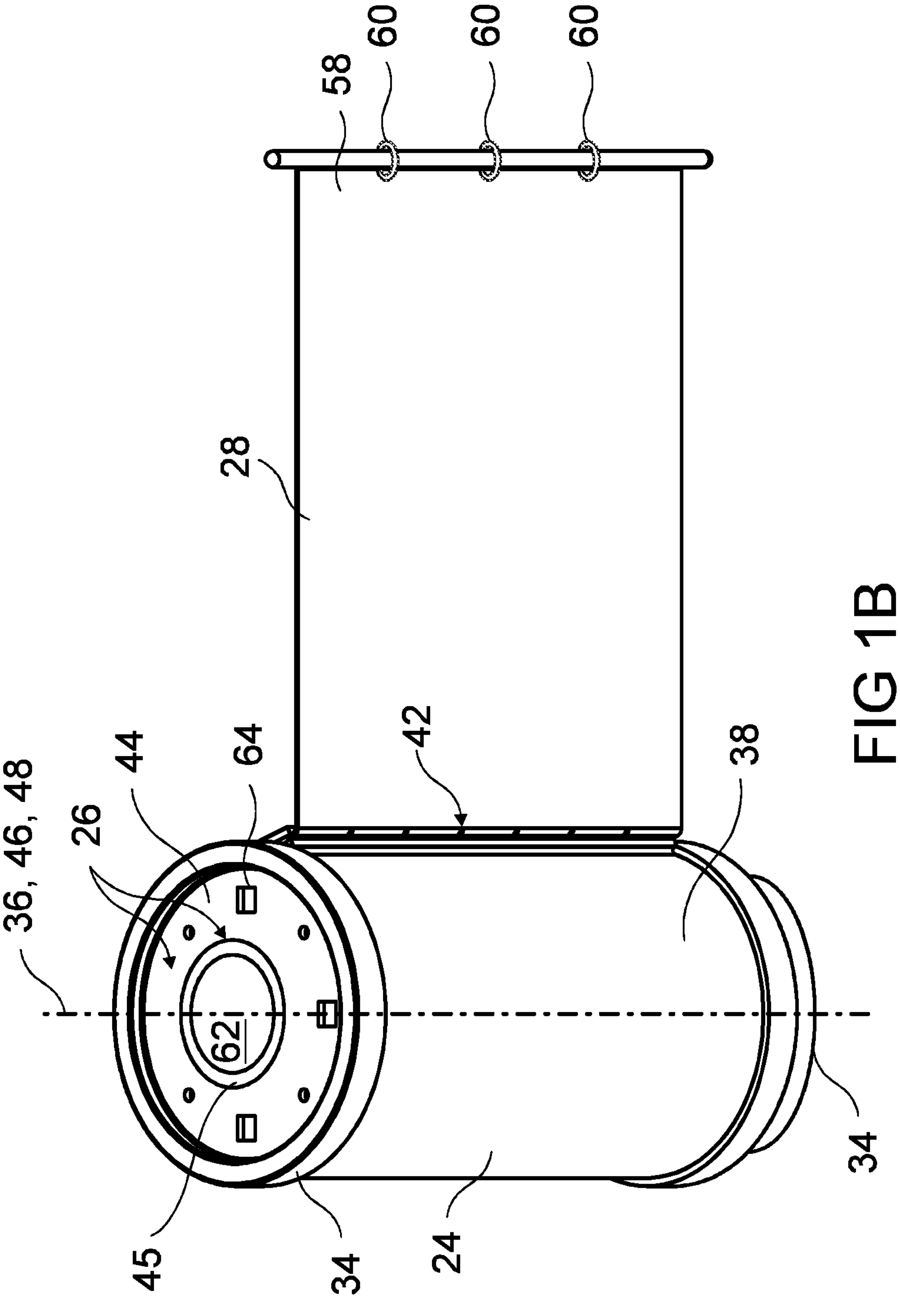
FIG. 1B shows a perspective view of the modular deployable display unit of FIG. 1A, illustrated with the flexible electronic display member of the display unit shown in an unwound configuration.
Figure 2:
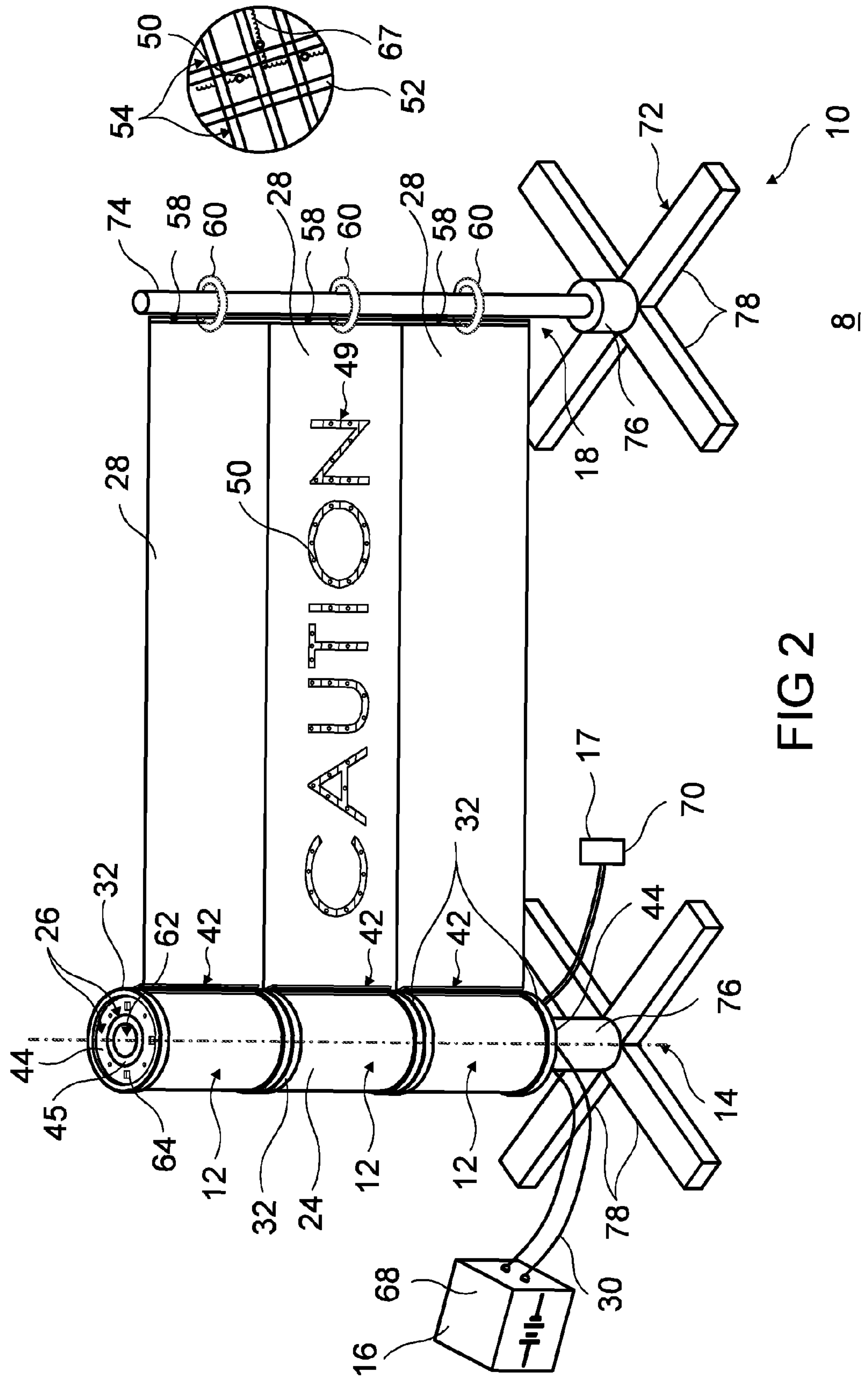
FIG. 2 shows a perspective view of a display system, in accordance with the invention, the display system including three modular deployable display units of FIG. 1B.
Figure 3:
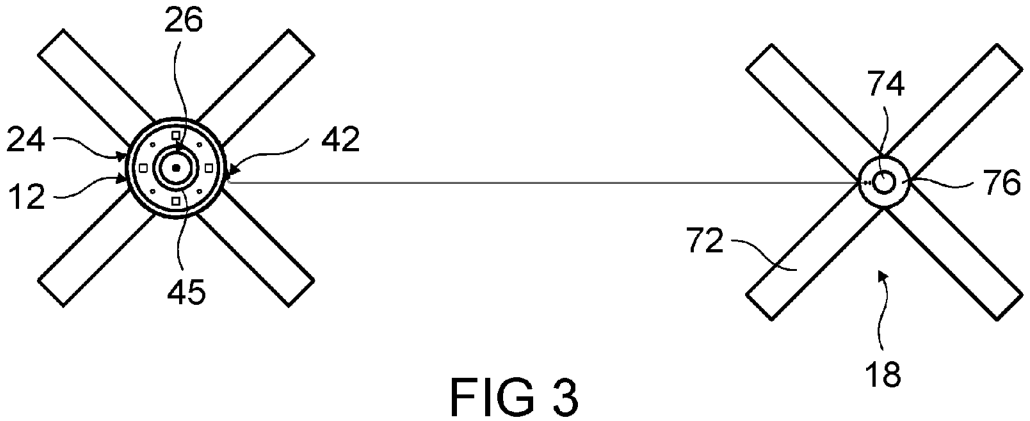
FIG. 3 shows a top view of the display system of FIG. 2.

With reference to FIGS. 1 to 3, a display system in accordance with the invention, in the form of a road traffic display system, is indicated generally by the reference numeral 10 (see FIG. 2). The road traffic display system 10 is adapted for use for displaying a message at the site of a traffic accident.

The system 10 includes three modular deployable display units 12, a base support structure in the form of a stand 14, a power source 16, a data input device 17, and a fixed support structure in the form of a display support 18.

Each modular deployable display units 12 includes a housing 24, a spool assembly 26, a flexible electronic display member 28, an electrical cable 30 and a connecting system 32.

The housing 24 of each unit 12 has an elongate configuration and defines a pair of opposite ends and a longitudinal axis 36 extending between the ends. The housing 24 includes a shell 38. The shell 38 defines a hollow internal chamber (not shown) located within the shell 38. The shell 38 has an opening 42 leading out of the hollow internal chamber defined by the shell 38.

The spool assembly 26 includes a spool 45 having a pair of opposite ends 44, the spool 45 being rotatably mounted to the ends 44 and defining a longitudinal axis 46 extending between the ends 44, the spool 45 defining an axis 48 of rotation about which the spool 45 is rotatable. The spool 45 is rotatably mounted within the internal chamber of the housing 24 in an arrangement wherein the axis 48 of rotation of the spool 45 is parallel to the longitudinal axis 36 of the housing 24. More specifically, the axis 48 of rotation of the spool 45 is co-axially aligned with the longitudinal axis 36 of the housing 24, as best illustrated in FIG. 1A.

The flexible electronic display member 28 is configured to display a programmable message 49, as will be explained in more detail hereinbelow. With reference to the magnified view in FIG. 2, the flexible electronic display member 28 includes a plurality of lamps in the form of light emitting diodes (LEDs) 50 for displaying the programmable message 49 and a flexible support member 52 for supporting the plurality of LEDs 50 thereon. In other embodiments (not shown), the lamps may be of any other type of light emitting lamps or elements, such as, for example, incandescent lighting. The number of LEDs 50 may vary and will be selected so as to be sufficient to display a message of a desired size and resolution.

The flexible support member 52 is of a brightly coloured light reflective material, so as to enhance the visibility of the flexible electronic display member 28. As shown in the magnified view in FIG. 2, the flexible support member 52 has a plurality of openings 54 extending therethrough, the purpose of which will be explained in more detail hereinbelow. More specifically, as shown in the magnified view of FIG. 2, the flexible support member 52 has a net-like configuration. More specifically, the flexible support member 52 has a knitted or a woven configuration. In other embodiments (not shown), the flexible support member may be made of other material, such as, for example, water repellant or water resistant material. The flexible support member may be of a desired size. Furthermore, a size of openings (comparable to openings 54) may vary according to the intended use and factors such as prevailing wind conditions.

The flexible electronic display member 28 has a fixed end (not shown) which is coupled to the spool 45. The flexible electronic display member 28 further has an opposite free end 58 and mounting formations in the form of rings 60 connected to the free end 58, for mounting the flexible electronic display member 28 to the fixed support structure 18, as shown in FIG. 2. More specifically, the flexible electronic display member 28 is displaceable between a wound configuration, as illustrated in FIG. 1A, and an unwound configuration, as illustrated in FIGS. 1B and 2. In the wound configuration, as illustrated in FIG. 1A, the flexible electronic display member is wound onto the spool 45 and located within the chamber of the housing 24. In the unwound configuration, as illustrated in FIGS. 1B and 2, the flexible electronic display member 28 is unwound from the spool 45. More specifically, as shown in FIGS. 1B and 2, when the flexible electronic display member 28 is in the unwound configuration, the flexible electronic display member 28 at least partially extends from the opening 42 in the shell 38 of the housing 24. As shown in FIG. 2, the rings 60 of the display member 28 are mounted to the fixed support structure 18. In other embodiments (not shown) connecting members other than the rings 60 may be used, for example, the connecting members can be in the form of magnets, hooks, or other known connecting members known in the art.

In use, the openings 54 defined in the flexible support member 52 permits passage of wind therethrough when the flexible electronic display member 28 is in the unwound configuration. As such, due to the openings 54, the flexible support member 52 is suitable for use in the outdoors, even in places which are particularly windy.

The electrical cable 30 is configured for supplying electrical energy to the electronic display member 28 for powering the LEDs 50 for displaying the programmable message 49. In other embodiments (not shown) each unit 12 may be supplied with its own power source. This power source may be disposed within a housing (equivalent to the housing 24). In such a case the electrical wiring may be disposed inside the housing.

The connecting system 32 is configured for connecting the display units 12 to one another, in an end to end arrangement. More particularly, as shown in FIG. 2, the connecting system 32 is configured to connect a particular one of the ends 44 of the spool 45 to the end 44 of the spool 45 of the adjacent modular deployable display unit 12. The connecting system 32 includes complementary connecting formations 34 defined on the ends 44 of the spool 45. More particularly, the complementary connecting formations 34 define complementary male and female parts which interconnect to one another.

The connecting system 32 further include means, in the form of a cylindrical passage 62 defined by an inner side of the spool 45, for releasably connecting the modular deployable display unit 12 to the stand 14 for supporting the display unit 12 on the substrate surface 8. More particularly, the cylindrical passage 62 provides for releasably connecting the operative lower end of the spool 45 the stand 14, as will be explained in more detail below.

The connecting system 32 further include electrical connecting means in the form of electrical connecting formations 64 and wires 67 for delivering electrical energy to the LED's 50. The electrical connecting formations 64 are defined on each of the ends 44 of the spool 45 for electrically connecting the modular deployable display units 12 in electrical contact with one another. The connecting system 32 further includes electrical connecting means in the form of electrical connecting formations 66 located on the stand 14 (not shown in FIGS. 1 to 3, see FIGS. 4A and 4B) which are configured for electrically connecting the spool 45 of the deployable display unit 12 and the stand 14, to one another. More specifically, the electrical connecting formations 66 electrically connect to the connecting formations 64 of the ends 44 of the spool 45, when the spool 45 is mounted to the stand 14, in use, as will be explained in more detail hereinbelow. The wires 67 are connected to the electrical connecting formations 64 and are configured for carrying electrical energy to the LEDs 50 for illuminating the LEDs 50 for displaying the programmable message 49, as will be explained in more detail hereinbelow.

The stand 14 is connectable to the modular deployable display unit 12, as shown in FIG. 2 and is locatable upon the substrate surface 8, for supporting the display unit 12 on the substrate surface. The stand 14 includes a vertical tube 76 and a number of support legs 78 mounted to the tube 76 for supporting the tube 76 in a substantially vertical configuration. The tube 76 is configured for supporting the display unit 12. More particularly, the dimensions of the tube 76 and the dimensions of the cylindrical passage 62 of the spool 45 of the display unit 12 permits the tube 76 to be slidingly received within the passage 62 of the spool in a snug sliding fit, for releasably connecting the spool 45 and the stand 14 to one another, as illustrated in FIG. 2. In some embodiment (not shown), the connecting system 32 may include locking formations (not shown) for locking the stand 14 and the unit 12 to one another. These locking formations may be in the form of complementary formations defined on the passage 62 and the tube 76. In other embodiments, other means known in the art may be used for coupling the display unit 12 to tube 76.

The power source 16 is in the form of a battery 68 for supplying electrical power to the flexible electronic display members 28 of the deployable display units 12. More particularly, the battery 68 is electrically connected via the electrical cable 30 to the base 14 and to the deployable display units 12, as shown in FIG. 2, in an arrangement wherein the battery 68 supplies electrical power to the flexible electronic display members 28 of each the modular deployable display units 12. More specifically, the electrical cable 30 is electrically connected to the electrical connecting formations 66 located on the stand 14 for delivering electrical power thereto. When the units 12 are mounted to the stand 14 and electrically coupled thereto, the electrical connecting formations 66 of the stand 14 are in electrical contact with the electrical connecting formations 64 defined on each of the ends 44 of the spool 45 for electrically connecting the modular deployable display units 12 with one another. Furthermore, when the units 12 are mounted to the stand 14, the electrical connecting formations 66 of the stand 14 are in electrical contact with the battery 68, for delivering electrical power to the LEDs 50 of the flexible electronic display members 52, via the wires 67 which are connected between the LEDs 50 and the electrical connecting formations 64 defined on each of the ends 44 of the spool 45. Different power sources known in the art may be used. By way of non-limiting example, the power source may be stationary or portable such as portable lithium batteries.

The data input device 17 is in data communication with the flexible electronic display member 28 and is configured for inputting the programmable message 49. More specifically, the data input device 17 includes a data input port 70 to which a cellular phone (not shown), laptop (not shown), tablet (not shown), digital keypad (not shown) or other similar type of electronic device (not shown), is connected for inputting the programmable message. In other embodiments (not shown), the data input device may have a built-in input mechanism such as, for example, a touch pad or key pad for programming the message 49. In other embodiments (not shown), the data input device may have physical keys for selecting pre-programmed messages, such as, for example, messages stored on a portable fixed memory storage device.

The support 18 is configured for supporting the flexible electronic display member 28, when the flexible electronic display member is in the unwound configuration, as shown in FIG. 2. More specifically, support 18 is configured for supporting the free end 58 of the flexible electronic display member 28 in an arrangement wherein the flexible electronic display member 28 extends between the spool 45 and the support 28, for displaying the programmable message 49, in use. The support 18 includes a base formation in the form of a stand 72 and an elongate support member in the form of a pole 74 which is mounted to the stand 72 in an arrangement wherein the pole 74 projects upwardly from the stand 72. More particularly, the stand 72 includes a support body in the form of a hollow vertical tube 76 to which the pole 74 is mounted and a number of support legs 78 mounted to the tube 76 for supporting the tube 76.

Figure 4A:
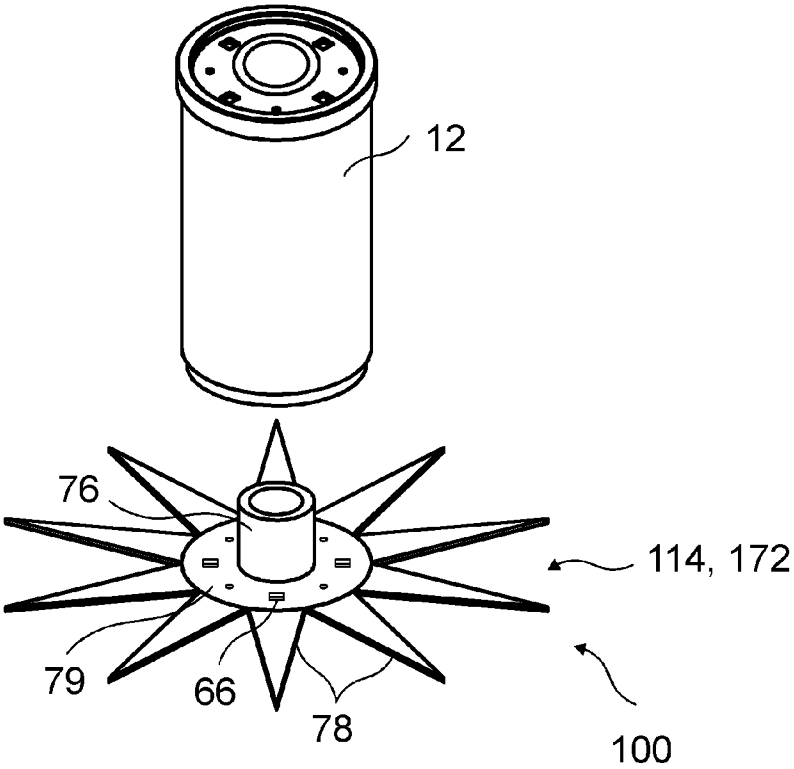
FIG. 4A shows a perspective view of another embodiment of a display system, in accordance with the invention.
Figure 4B:
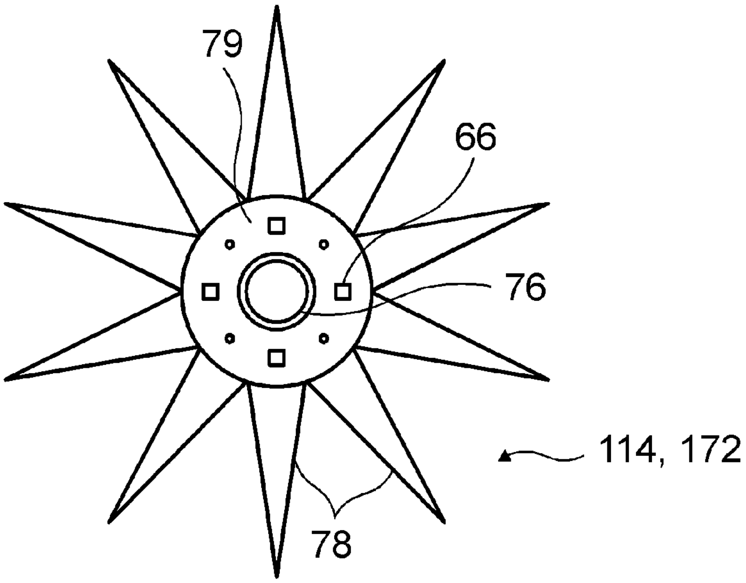
FIGS. 4B to 4E show perspective views of a stand forming a part of the display system of FIG. 4A, illustrated with support legs of the stand shown in various positions.
Figure 4C:
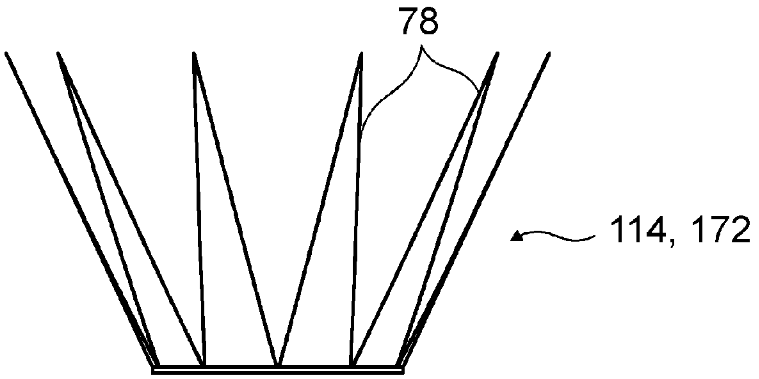
Figure 4D:
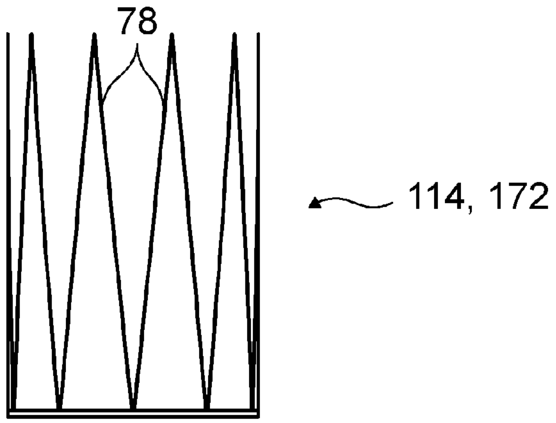
Figure 4E:
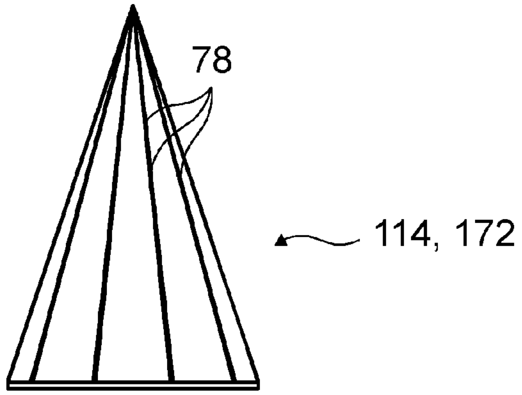

With reference to FIGS. 4A to 4E, another embodiment of a display system in accordance with the invention, in the form of a road traffic display system, is indicated generally by the reference numeral 100 (see FIG. 4A).

There are many similarities between the display system 10 of FIGS. 1 to 3 and the display system 100 of FIGS. 4A to 4E. In FIGS. 4A to 4E, the features of the system 100 which are the same and/or similar to features of the system 10 shown in FIGS. 1 to 3 of the drawings, are designated by the same and/or similar reference numerals in FIGS. 4A to 4E. What is stated above with respect to the system 10 of FIGS. 1 to 3 applies generally to the system 100 of FIGS. 4A to 4E.

The system 100 includes a modular deployable display unit 12 and a stand 114, 172, which differs from the stand 14, 72 of the system 10 of FIGS. 1 to 3.

More particularly, as illustrated in FIGS. 4A to 4E, the stand 114,172 includes a support body 79 and a number of support legs 78 mounted to the body 79 for support the body 79. The support body 79 has a circular shape in top view. The stand 114,172 further includes a hollow vertical tube 76 projecting substantially vertically upwardly from the support body 79.

The support legs 78 of the stand 114,172 have a triangular shape and are displaceably mounted to the support body 79 so as to be displaceable between a deployed position (shown in FIG. 4A) wherein the support legs 78 are placed into contact with the substrate surface 8 and locked in place, for stabilising the support body 79; and a stowed position (shown in FIG. 4E) wherein the support legs 78 fold inwardly towards the support body 79 so as to surround the support body 79 and assume a compact configuration, to facilitate stowage of the stand 114,172. More particularly, a proximal side of the support legs 78 is displaceably mounted to the support body 79 and two unattached sides of the support leg 78 are free. More specifically, each triangularly shaped support leg 78 is dimensioned so that when the support legs 78 are displaced into the stowed position, the unattached sides of the support leg 78 are disposed adjacent one another and placed into contact with one another, such that the support legs 78 and the support body 79 assume a cone shape.

Because the stand 114,172 includes a hollow vertical tube 76 and a number of support legs 78, the stand 114, 172 can perform the same function as the stand 14 and the stand 72. Accordingly the stand 114, 172 can be used to replace the stand 14 and/or the stand 72, shown in FIGS. 1 to 3. More specifically, when the stand 114,172 replaces the stand 72 of FIGS. 1 to 3, the pole 74 is mounted to the tube 76 in the same manner as is the case with the stand 72, as illustrated in FIG. 2. Furthermore, when the stand 114,172 replaces the stand 14 of FIGS. 1 to 3, the modular deployable display unit 12 is mounted to the tube 76 in the same manner in which the modular deployable display unit 12 shown in FIG. 2 is mounted to the stand 14. More specifically, the tube 76 is received within the hollow cylindrical passage 62 defined by the inner side of spool 45.

Figure 5A:
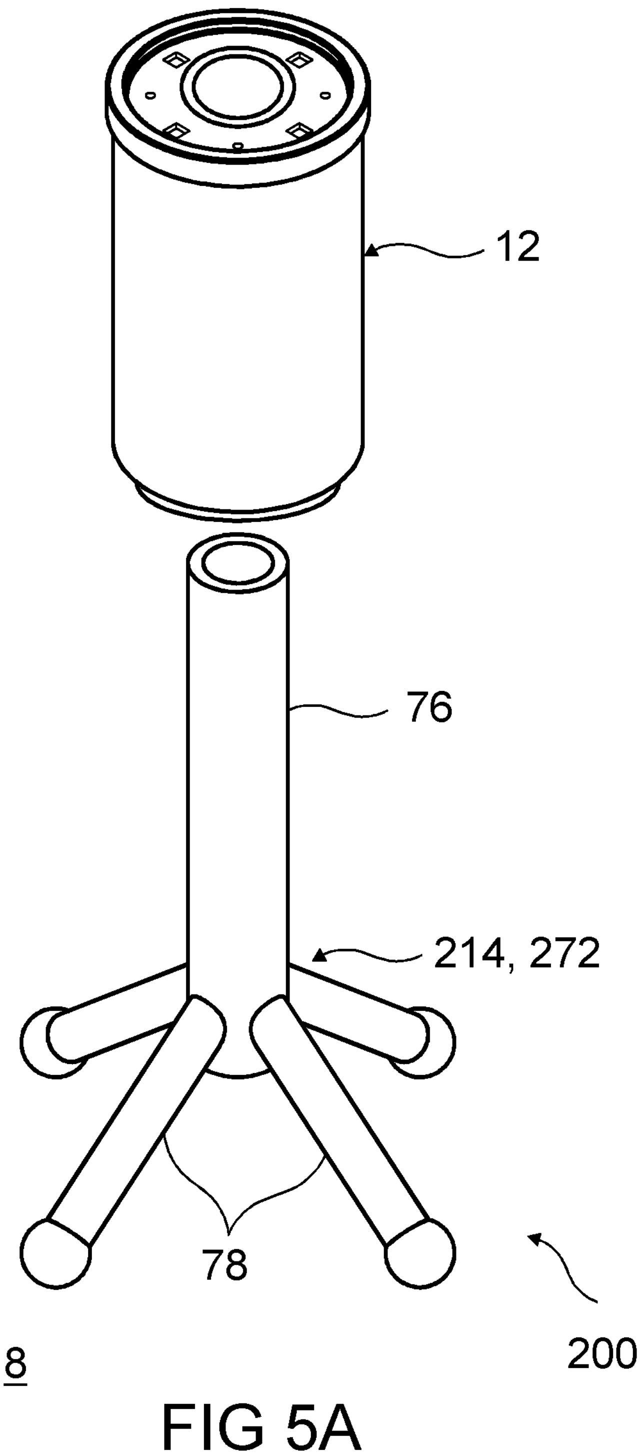
FIG. 5A shows an exploded perspective view of still another embodiment of a display system, in accordance with the invention.

With reference to FIG. 5A, another embodiment of a display system in accordance with the invention, in the form of a road traffic display system, is indicated generally by the reference numeral 200.

There are many similarities between the display system 10 of FIGS. 1 to 3 and the display system 200 of FIG. 5A. In FIG. 5A, the features of the system 200 which are the same and/or similar to features of the system 10 shown in FIGS. 1 to 3 of the drawings, are designated by the same and/or similar reference numerals in FIG. 5A. What is stated above with respect to the system 10 of FIGS. 1 to 3 applies generally to the system 200 of FIG. 5A.

The system 200 includes a modular deployable display unit 12 and a stand 214, 272, which differs from the stand 14, 72 of the system 10 of FIGS. 1 to 3.

More particularly, as illustrated in FIG. 5A, the stand 214, 272 includes a tube 76 and a number of support legs 78 mounted to the tube 76 for supporting the tube 76.

Because the stand 214,272 includes the tube 76 and a number of support legs 78, the stand 214, 272 can perform the same function as the stand 14 and the stand 72. As such, the stand 214,272 can be a substitute for the stand 14, 72.

Figure 5B:
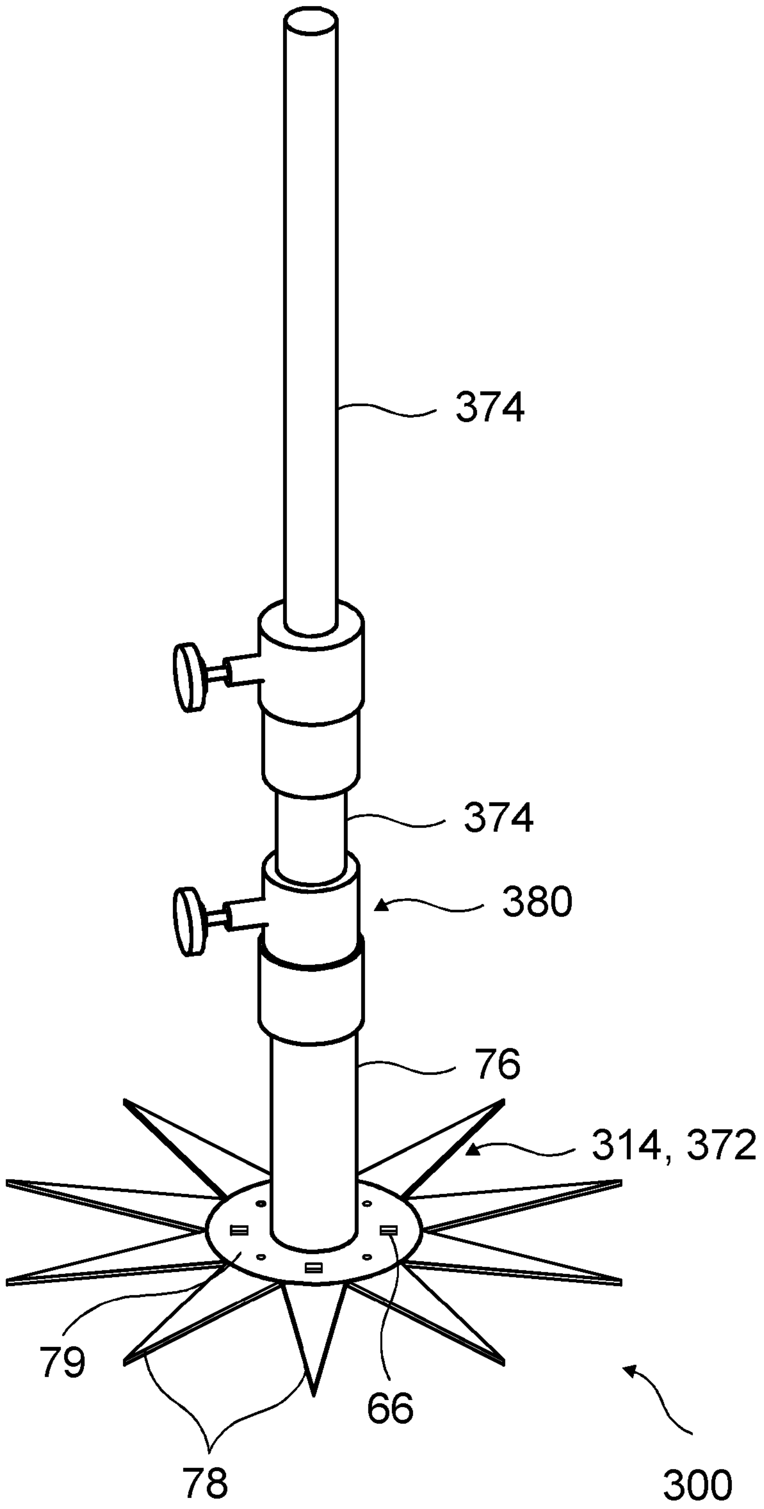
FIG. 5B shows an exploded perspective view of a final embodiment of a display system, in accordance with the invention.

With reference to FIG. 5B, another embodiment of a display system in accordance with the invention, in the form of a road traffic display system, is indicated generally by the reference numeral 300.

There are many similarities between the display system 10 of FIGS. 1 to 3 and the display system 300 of FIG. 5B. In FIG. 5B, the features of the system 300 which are the same and/or similar to features of the system 10 shown in FIGS. 1 to 3, are designated by the same and/or similar reference numerals in FIG. 5B. What is stated above with respect to the system 10 of FIGS. 1 to 3 of the drawings applies generally to the system 300 of FIG. 5B.

The system 300 includes a modular deployable display unit 12; a stand 314, 372 and an elongate support member in the form of a pole 374. The stand 314, 372 differs from the stand 14, 72 of the system 10 of FIGS. 1 to 3. More particularly, as illustrated in FIG. 5A, the stand 314,372 includes tube 76 which projects upwardly and a number of support legs 78 mounted to the tube 76 for supporting the tube 76.

Because the stand 314, 372 includes the tube 76 and the support legs 78, the stand 314, 372 can perform the same function as the stand 14 and the stand 72. As such, the stand 314,372 can be a substitute for the stand 14, 72.

The pole 374 of the system 300 differs from the pole 74 of the system 10 of FIGS. 1 to 3 of the drawings. More specifically, the pole 374 is telescopically extendible to facilitate stowage of the pole 374, in use. The applicant envisages that the pole 374 may be telescoped into a compact configuration and stowed within the cone shaped body formed by the support legs 78 when the stand 314,372 is displaced into the stowed position. In another embodiment (not shown), the applicant envisages that, in use, the pole 374 may be used in conjunction with the stand 114,172. In some embodiments, holding means 380 may be used to hold sections of the telescopically extendible pole 374 in an expanded position. Different holing means known in the art may be used to allow for holding the section of the telescopically extendible pole 374 in an expanded position and for the releasing or the section so that the pole 374 may be collapsible.

In another embodiment, not shown, the applicant envisages that a display system in accordance with the invention, will include a modular deployable display unit similar to the modular deployable display unit 12, but without a housing 24. Furthermore, in other embodiment (not shown) the applicant envisages that the free end 58 of the flexible electronic display member 28 will be connected to an additional spool assembly which is identical or similar to the spool assembly 26 described hereinabove. As such, the applicant envisages that the flexible electronic display member 28 will extend between the spools of the spool assemblies and can be wound on either one or both of these spools, in use. In other embodiments, (not shown), the flexible member may be permanently fixed at each end to a spool assembly similar to the spool assembly 26. In other embodiments (not show), the flexible member may be detachable from the spool to allow for maintenance and/or replacement of the flexible member.

The applicant also envisages that the system 10, 100, 200, 300 may be used in other circumstances, other than in the case of a traffic accident. For example, the applicant envisages that the system 10, 100, 200, 300 may be used at any mass gathering, disaster sight, evacuation sites, medical emergency, campus event, or the like. Furthermore, the applicant envisages that the system 10, 100, 200, 300 provides a highly portable display apparatus which can be used to form screens of desired sizes, depending on the requirements. More specifically, a desired number of modular deployable display units 12 can be connected to one another in an end to end arrangement so as to form a screen of a desired size.

The applicant envisages that the system 10, 100, 200, 300, can be easily transported in a police vehicle, due to its modular, compact and stowable features. More specifically, the applicant envisages that the system 10, 100, 200, 300 can be easily transported because the flexible electronic display member 28 can be displaced into the wound configuration. Furthermore, the applicant envisages that the system 10, 100, 200, 300 can be very quickly deployed and packed up and stowed due to the modular nature thereof and due to the fact that the flexible electronic display member 28 can be displaced into the wound configuration.

Furthermore, the applicant envisages that when deployed at an accident scene, the flexible electronic display member 28 of the system 10, 100, 200, 300 will obstruct the accident scene and provide useful information to passing motorists, such as, for example, notification of the accident, or, alternatively, warning the passing motorists of a fine if they slow down the traffic. Because the flexible electronic display member 28 blocks the scene and provides information, the applicant envisages that passing motorists will not stop or slow down in order to satisfy their curiosity. As such, the applicant envisages that traffic jams can be avoided at an accident scene by deploying the system 10, 100, 200, 300.

The invention extends also to a modular deployable display unit 12, separate and apart from the system, as described and defined hereinabove. It will be understood that whereas in some embodiments, only one display unit 12 is shown, clearly, multiple display units 12 may be used in any of the described embodiments.

It will be appreciated that the exact configuration of the system 10, 100, 200, 300, and the unit 12, in accordance with the invention, may vary greatly while still incorporating the essential features of the invention as described hereinabove. For example, in another embodiment (not shown) the spool assembly (not shown) may include a spool (not shown) having a pair of opposite fixed ends (not shown). As such, the spool (not shown) is fixed to the ends (not show) and not rotatable relative to the ends (not shown), such that the spool (not shown) and the ends (not shown) are rotatable in unison with one another.

In another embodiment (not shown), the spool assembly may be similar to spool assembly 26, but may include a mechanism for winding and/or unwinding the flexible member onto and/or off the spool. Such mechanism may be manually or electrically operable for rotating the spool about its axis of rotation, for winding the flexible member onto the spool. Different mechanisms known in the art may be used for this purpose.

Interpretation of Terms

Unless the context clearly requires otherwise, throughout the description and the claims:

- "comprise," "comprising," and the like are to be construed in an inclusive sense, as opposed to an exclusive or exhaustive sense; that is to say, in the sense of "including, but not limited to".
- "connected," "coupled," or any variant thereof, means any connection or coupling, either direct or indirect, between two or more elements; the coupling or connection between the elements can be physical, logical, or a combination thereof.
- "herein," "above," "below," and words of similar import, when used to describe this specification shall refer to this specification as a whole and not to any particular portions of this specification.
- "or," in reference to a list of two or more items, covers all of the following interpretations of the word: any of the items in the list, all of the items in the list, and any combination of the items in the list.
- the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

Where a component (e.g. a circuit, module, assembly, device, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of systems, methods and apparatus have been described herein for purposes of illustration. These are only examples. The technology provided herein can be applied to systems other than the example systems described above. Many alterations, modifications, additions, omissions and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

It is therefore intended that the following appended claims and claims hereafter introduced are interpreted to include all such modifications, permutations, additions, omissions and sub-combinations as may reasonably be inferred. The scope of the claims should not be limited by the preferred embodiments set forth in the examples, but should be given the broadest interpretation consistent with the description as a whole.

What is claimed is:

1. A modular deployable display unit comprising:

a spool having a pair of opposite ends and a longitudinal axis extending between the ends, the spool defining an axis of rotation about which the spool is rotatable;

a flexible electronic display member which is configured to display a programmable message, the flexible electronic display member being releasably coupled to the spool and being displaceable between: a wound configuration wherein the flexible electronic display member is wound onto the spool; and an unwound configuration wherein the flexible electronic display member is unwound from the spool;

at least one electrical cable for supplying electrical energy to the flexible electronic display member; and connecting means including at least one connecting formation configured for physically releasably connecting the modular deployable display unit to an additional modular deployable display unit, in an end to end arrangement.

2. A modular deployable display unit as claimed in claim 1, wherein the modular deployable display unit further comprises an elongate housing having a pair of opposite ends and a longitudinal axis extending between the ends.

3. A modular deployable display unit as claimed in claim 2, wherein the housing comprises a shell defining a hollow internal chamber located within the shell.

4. A modular deployable display unit as claimed in claim 3, wherein the shell has an opening leading out of the shell.

5. A modular deployable display unit as claimed in claim 4, wherein the spool is rotatably mounted within the internal chamber of the housing in an arrangement wherein the axis of rotation of the spool is parallel to the longitudinal axis of the housing.

6. A modular deployable display unit as claimed in claim 5, wherein the spool is rotatably mounted within the hollow internal chamber of the housing in an arrangement wherein the flexible electronic display member is located within the internal chamber of the housing when the flexible electronic display member is in the wound configuration.

7. A modular deployable display unit as claimed in claim 6, wherein, when the flexible electronic display member is in the unwound configuration, the flexible electronic display member at least partially extends from the opening in the shell.

8. A modular deployable display unit as claimed in claim 1, wherein the at least one connecting formation is configured to connect a particular one of the ends of the spool to an end of a spool of the additional modular deployable display unit.

9. A modular deployable display unit as claimed in claim 1, wherein the connecting means further comprises means for releasably connecting the modular deployable display unit to a base support structure for supporting the display unit on a substrate surface.

10. A modular deployable display unit as claimed in claim 9, wherein the connecting means provides for releasably connecting a particular one of the ends of the spool to the base support structure.

11. A modular deployable display unit as claimed in claim 9, wherein the connecting means further includes electrical connecting means configured for electrically connecting the spool of the deployable display unit and the base support structure, to one another.

12. A modular deployable display unit as claimed in claim 1, wherein the at least one connecting formation comprises complementary connecting formations defined on the ends of the spool.

13. A modular deployable display unit as claimed in claim 12, wherein the complementary connecting formations define complementary male and female parts which interconnect to one another.

14. A modular deployable display unit as claimed in claim 1, wherein the connecting means further includes electrical connecting means for electrically connecting the modular deployable display unit and the additional modular deployable display unit, in electrical contact with one another.

15. A modular deployable display unit as claimed in claim 1, wherein the flexible electronic display member comprises a plurality of light emitting diodes (LEDs) for displaying the programmable message.

16. A modular deployable display unit as claimed in claim 1, wherein the flexible electronic display member has a fixed end which is coupled to the spool and in use, allows the flexible electronic display member to wind on the spool when the spool rotates around its rotation axis, the flexible electronic display member also has an opposite free end and mounting formations disposed at or near the free end thereof, for mounting the flexible electronic display member to a fixed support structure.

17. A display system comprising:

two or more modular deployable display units, each modular deployable display unit being a modular deployable display unit as claimed in claim 1.

18. A display system as claimed in claim 17, wherein the display system further comprises a base support structure which is connectable to at least one of said two or more modular deployable display units, the base support structure being locatable upon a substrate surface for supporting the display unit on the substrate surface.

19. A display system as claimed in claim 17, wherein the display system further comprises a data input device for inputting the programmable message.

20. A display system as claimed in claim 17, wherein the display system further comprises a fixed support structure for supporting the flexible electronic display member, when the flexible electronic display member is in the unwound configuration.

* * * * *